(12) United States Patent
McCann (10) Patent No.: US 11,257,734 B2
(45) Date of Patent: Feb. 22, 2022

(54) THERMAL MANAGEMENT PACKAGE AND METHOD

(71) Applicant: Microchip Technology Inc., Chandler, AZ (US)

(72) Inventor: Damian McCann, Rossmoor, CA (US)

(73) Assignee: Microchip Technology Inc., Chandler, AZ (US)

( * ) Notice: Subject to any disclaimer, the term of this patent is extended or adjusted under 35 U.S.C. 154(b) by 119 days.

(21) Appl. No.: 16/816,874

(22) Filed: Mar. 12, 2020

(65) Prior Publication Data

US 2021/0210402 A1   Jul. 8, 2021

Related U.S. Application Data

(60) Provisional application No. 62/958,639, filed on Jan. 8, 2020.

(51) Int. Cl.
*H01L 23/367* (2006.01)
*H01L 23/373* (2006.01)

(52) U.S. Cl.
CPC ........ *H01L 23/367* (2013.01); *H01L 23/3732* (2013.01); *H01L 23/3735* (2013.01)

(58) Field of Classification Search
CPC ..... H01L 23/36; H01L 23/367; H01L 23/373; H01L 23/3732; H01L 23/3736; H01L 2224/32245–3226
See application file for complete search history.

(56) References Cited

U.S. PATENT DOCUMENTS

| 3,777,220 A | 12/1973 | Tatusko et al. |
| 4,630,171 A | 12/1986 | Dubuisson et al. |
| 6,607,928 B1 | 8/2003 | Eiles et al. |
| 7,859,098 B2 | 12/2010 | Ong et al. |
| 8,546,929 B2 | 10/2013 | Ong et al. |
| 2012/0199955 A1* | 8/2012 | Sun .................. H01L 23/49827 257/629 |
| 2014/0035521 A1 | 2/2014 | Endo |
| 2015/0237729 A1 | 8/2015 | Brunschwiler et al. |

FOREIGN PATENT DOCUMENTS

| EP | 0588651 A1 | 3/1994 |
| WO | 2017200561 A1 | 11/2017 |

OTHER PUBLICATIONS

PCT/US2020/041216, International Search Report and Written Opinion, European Patent Office, dated Oct. 14, 2020.

* cited by examiner

*Primary Examiner* — Tucker J Wright
(74) *Attorney, Agent, or Firm* — Glass and Associates; Kenneth D'Alessandro; Kenneth Glass (57) ABSTRACT

A thermal management package for a semiconductor device includes a high dielectric constant material substrate, a high thermal conductivity slug disposed in a first window in the high dielectric constant material substrate and held therein by a first bonding material, an outer substrate formed from a material having a low dielectric constant and having a second window formed therein, the high dielectric constant material substrate disposed in the second window in the low dielectric constant outer substrate and held therein by a second bonding material.

17 Claims, 6 Drawing Sheets

THERMAL MANAGEMENT PACKAGE AND METHOD

The present invention relates to semiconductor mounting structures. More particularly, the present invention relates to an embedded high thermal conductivity slug held within a high dielectric constant material substrate that is placed within a window in a low dielectric constant outer substrate.

BACKGROUND

The ultimate goal of high-power radio frequency (RF) semiconductor technology, especially GaN semiconductor technology is to replace vacuum-tube based power solutions at all frequencies. One problem that needs to be addressed is that solid-state power devices are presently limited in their ability to generate kilowatts of power in a light weight and small size, lower-cost packaging. What is needed is smaller and more capable power devices coupled with smaller and more capable pallet/module solutions to improve thermal management, reduce the size, weight and lower the cost of the solution.

Figure 1A:
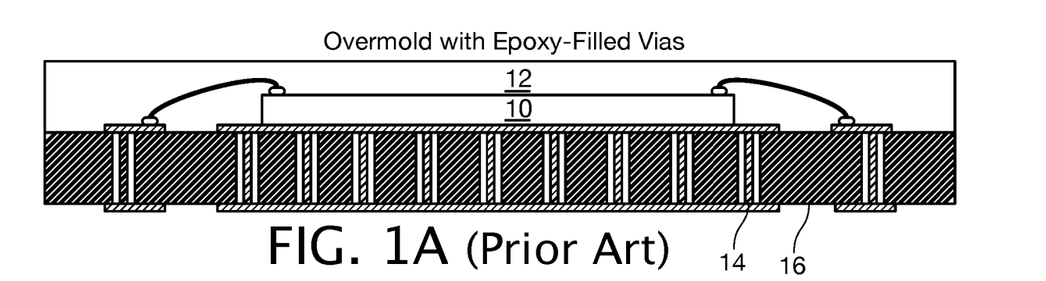
FIG. 1A through FIG. 1D are diagrams showing cross sectional views of semiconductor mounting structures showing the evolution of thermal management techniques.

FIGS. 1A through 1D are diagrams showing cross sectional views of semiconductor mounting structures used as thermal management packages that illustrate some of the evolution of thermal management techniques for power semiconductors including RF power devices. FIG. 1A is a cross-sectional view showing a semiconductor mounting structure for a power semiconductor device 10 that employs a thermoset plastic overmold layer 12 with epoxy-filled plated-through vias (one of which is identified by reference numeral 14) disposed through a circuit board 16 below a semiconductor device 10. The epoxy filled plated-through vias provide a thermal path for heat removal from the semiconductor device to the bottom face of the circuit board 16. The circuit board 16 is a conventional laminate known in the art. Typical costs of such packaging techniques are on the order of $0.01/mm$^2$.

Figure 1B:
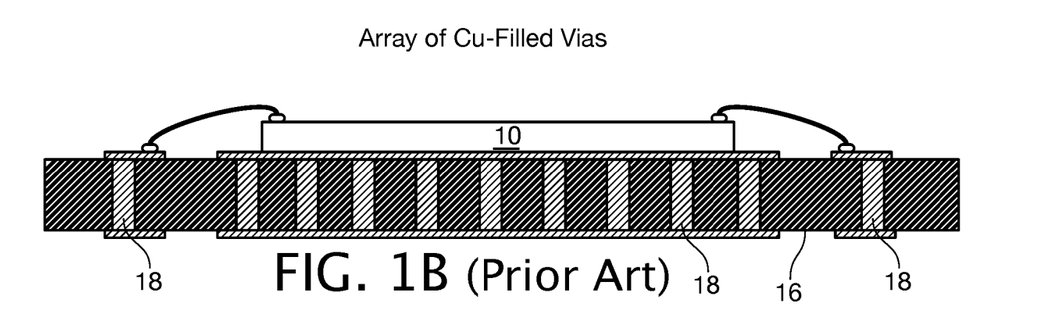

FIG. 1B is a cross-sectional view showing a semiconductor mounting structure for a power semiconductor device that employs an array of Cu-filled vias (one of which is identified by reference numeral 18) disposed below the semiconductor device 10. Cu-filled vias 18 are also used to make contact between traces on the upper and lower sides of the circuit board 16. The copper filled plated-through vias provide a thermal path for heat removal from the semiconductor device to the bottom face of the circuit board 16. The circuit board 16 is a conventional laminate known in the art. A lid (not shown) may be used to cover and seal the structure as is known in the art. Typical costs of such packaging techniques are on the order of $0.03/mm$^2$.

Figure 1C:
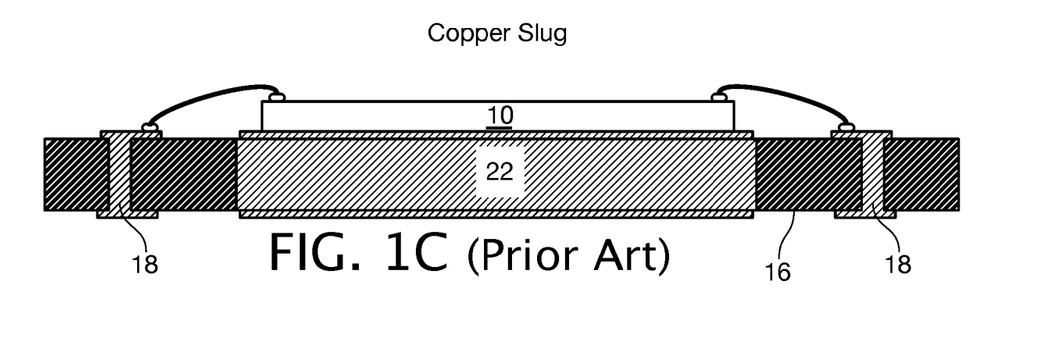

FIG. 1C is a cross-sectional view showing a semiconductor mounting structure for a power semiconductor device that employs a copper "slug" insert 22 disposed below and in thermal contact with the semiconductor device 10. Cu-filled vias 18 are also used to make contact between traces on the upper and lower sides of the board. The circuit board 16 is a conventional laminate known in the art. The copper slug insert 22 provides a path for thermal management. As with the prior-art package shown in FIG. 1B, a lid (not shown) may be used to cover and seal the structure as is known in the art. Typical costs of such packaging techniques are on the order of $0.06/mm$^2$.

Figure 1D:
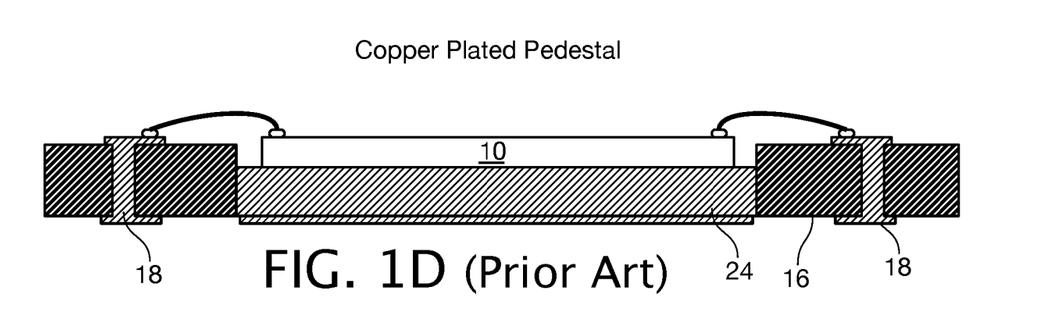

FIG. 1D is a cross-sectional view showing a semiconductor mounting structure for a power semiconductor device that employs a slug in the form of a copper-plated pedestal insert 24 disposed below and in thermal contact with the semiconductor device 10. Cu-filled vias 18 are also used to make contact between traces on the upper and lower sides of the circuit board 16. The circuit board 16 is a conventional laminate known in the art. As with the prior-art package shown in FIG. 1B and FIG. 1C, a lid (not shown) may be used to cover and seal the structure as is known in the art. Typical costs of such packaging techniques are on the order of $0.07/mm$^2$.

While the progression of thermal management technology illustrated by the techniques shown in FIGS. 1A though 1D has improved, i.e. the semiconductor mounting structure of FIG. 1D provides improved thermal management over that of FIG. 1C, the semiconductor mounting structure of FIG. 1C provides improved thermal management over that of FIG. 1B, and the semiconductor mounting structure of FIG. 1B provides improved thermal management over that of FIG. 1A, the fabrication cost has also increased.

Another issue that must be managed in packaging RF power semiconductor devices is RF impedance matching between the RF power semiconductor devices and the circuitry to which they are coupled. The physical size of RF matching circuitry is reduced by using a material for the circuit board on which the power semiconductor device is mounted which has a dielectric constant higher than about 4, defined over the operating frequency of the RF power semiconductor device. Material having a dielectric constant higher than about 4, defined over the operating frequency of the RF power semiconductor device, will be referred to herein as a high dielectric constant material. Material having a dielectric constant of 4, or below, defined over the operating frequency of the RF power semiconductor device, will be referred to herein as a low dielectric constant material.

In addition to the semiconductor mounting structures shown in FIGS. 1A through 1D, prior-art approaches to thermal management of RF power semiconductor devices also include embedded metal in board (EMIB) technology such as a technology that employs a slug that is embedded in a high dielectric constant laminate circuit board material. The embedding process adds to the cost. This technology has a relatively large footprint and adds significant weight. For the purposes of this document a slug is defined as a circular or polygonally-shaped piece of a high thermal conductivity material, having a length and width (or diameter) greater than its thickness.

The use of metal slugs in such relatively large footprint high dielectric constant laminate circuit board materials is prone to cracking around the slug due to the softness of the high dielectric constant laminate material and as a result requires a stiffener to be included in the board design, adding to the complexity and cost of the board.

Prior art EMIB technology inserted Cu or AlN slugs in FR4 or similar commercial laminate materials. It would be desirable to insert such slugs into high dielectric constant laminate materials having $\varepsilon_r$ of greater than about 4 vs an $\varepsilon_r$ of 3.14 of FR4. Use of a high dielectric constant material would reduce the size of the matching circuit and has been typically used in RF power pallets; the high dielectric constant material are in those cases then laminated to metal carriers for strength. A problem with the use of high dielectric constant laminate materials is that they are soft and difficult to work with when embedding slugs. Because the impedance of a metal line is derived from, among other factors, the dielectric constant of the substrate on which it is formed, the use of high dielectric constant laminate material also makes all lines including bias lines and 50-ohm transmission lines narrower, thus limiting current and power handling capability.

BRIEF DESCRIPTION

The present invention is directed to a thermal management package employing embedded high thermal conductivity material, such as a metal in the form of a slug, enhanced by disposing it within a first window in a high dielectric constant material substrate disposed within a second window in a low dielectric constant outer substrate that provides a smaller and therefore more compact geometry for printed impedance matching components and wider lines on the low dielectric material for feeding bias and high power signal transmission when compared to the prior art. The present invention is mechanically robust, eliminates cracks, reduces cost and size, improves manufacturability and reduces weight for high-power module and pallet solutions.

In accordance with the present invention, a slug having a high thermal conductivity (greater than about 250 W/meter-kelvin) is bonded in a window in a high dielectric constant material to form a sub-assembly, and then that sub-assembly is inserted into a low dielectric material, improving electrical performance and enhancing manufacturability. The present invention allows for selection of high-dielectric constant materials with an $\varepsilon_r$ of greater than about 4. Such materials include Titanate ceramics with dielectric constant of 30 and above. This allows a greatly reduced size of the RF matching solution.

In the case of high-power GaN power amplifiers the present invention employs a high thermal conductivity material held in a material with an $\varepsilon_r$ of greater than about 4, and bonded within a window in a low dielectric constant outer substrate formed from a structurally robust material (a material with an $\varepsilon_r$ of less than about 4).

The low dielectric constant outer substrate allows use of wider line widths to produce the same characteristic impedance as compared to line widths using higher dielectric constant material, at the same time allowing handling higher RF power and higher current handling DC line feeds. The low dielectric constant outer substrate is more structurally robust, is stiffer than and significantly lower in cost than the high dielectric constant material substrate, greatly improving size, manufacturing yields and cost.

When the outputs of impedance matched microwave monolithic integrated circuits (MMICs) are being combined, the present invention is a lower cost solution than the use of couplers printed directly on GaN devices because the couplers of the present embodiments can be directly printed on the high dielectric constant material substrate. Center frequencies of the splitters and combiners can be varied by selecting from among ring designs for the high-dielectric constant material. The laterally bounding low dielectric constant material then allows for a lower loss wideband mm-wave transition.

In accordance with an aspect of the invention, a thermal management package for a semiconductor device includes a high dielectric constant material substrate, a high thermal conductivity slug disposed in a first window in the high dielectric constant material substrate and held therein by a first bonding material, an outer substrate formed from a material having a low dielectric constant and having a second window formed therein, the high dielectric constant material substrate disposed in the second window in the low dielectric constant outer substrate and held therein by a second bonding material.

In accordance with an aspect of the invention, the high thermal conductivity slug is formed from one of Cu, AlN, and diamond.

In accordance with an aspect of the invention, the high dielectric constant material substrate is a ceramic-Polytetrafluoroethylene composite material.

In accordance with an aspect of the invention, the low dielectric constant outer substrate is a printed circuit board laminate material.

In accordance with an aspect of the invention, the thermal management package further includes a semiconductor device mounted on the high thermal conductivity slug, and circuitry disposed on the high dielectric constant material substrate and electrically coupled to the semiconductor device. The high dielectric constant material substrate includes at least one conductive trace having a geometry selected to provide an impedance transition between an output of the semiconductor device and the circuitry disposed on the low dielectric constant outer substrate.

In accordance with an aspect of the invention, the semiconductor device is one of a GaN and a SiC semiconductor device.

In accordance with an aspect of the invention, a method for packaging a semiconductor device includes forming a first window in a high dielectric constant material substrate, forming a pattern of conductive traces on a first major face of the high dielectric constant material substrate, securing a high thermal conductivity slug in the first window by a first bonding material, forming a second window in an outer substrate formed from a material having a low dielectric constant, forming a pattern of conductive traces on a first major face of the low dielectric constant outer substrate, and securing the high dielectric constant material substrate into the second window in the low dielectric constant outer substrate by a second bonding material.

In accordance with an aspect of the invention, the method further includes mounting a semiconductor device on the high thermal conductivity slug and connecting leads or I/O pads of the semiconductor device to ones of conductive traces on the major face of the high dielectric constant material substrate, connecting together selected conductive traces on the low dielectric constant outer substrate and the high dielectric constant material substrate, and mounting circuitry on the low dielectric constant outer substrate and electrically coupling the circuitry to the conductive traces on the major face of the low dielectric constant outer substrate.

In accordance with an aspect of the invention, the high dielectric constant material substrate includes a ceramic or ceramic-Polytetrafluoroethylene composite material.

In accordance with an aspect of the invention, the high thermal conductivity slug in the method includes one of Cu, AlN, and diamond.

In accordance with an aspect of the invention, the low dielectric constant outer substrate in the method includes printed circuit board laminate material.

In accordance with an aspect of the invention, connecting together selected conductive traces on the low dielectric constant outer substrate and the high dielectric constant material substrate includes connecting together selected conductive traces on the low dielectric constant outer substrate and the high dielectric constant material substrate using a plating process.

In accordance with an aspect of the invention, connecting together selected conductive traces on the low dielectric constant outer substrate and the high dielectric constant material substrate using the plating process includes using one of a Ni/Au and a Ni/Pd/Au plating process.

In accordance with an aspect of the invention, connecting together selected conductive traces on the low dielectric constant outer substrate and the high dielectric constant material substrate includes connecting together selected conductive traces on the low dielectric constant outer substrate and the high dielectric constant material substrate using wire bonding.

In accordance with an aspect of the invention, connecting together selected conductive traces on the low dielectric constant outer substrate and the high dielectric constant material substrate includes connecting together selected conductive traces on the low dielectric constant outer substrate and the high dielectric constant material substrate using an electronic component.

In accordance with an aspect of the invention, the high dielectric constant material substrate in the method includes at least one conductive trace that exhibits a geometry selected to provide an impedance transition between an output of the mounted semiconductor device and circuitry disposed on the low dielectric constant outer substrate.

In accordance with an aspect of the invention, mounting the semiconductor device in the method includes mounting one of a GaN and a SiC semiconductor device.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

Figure 2:
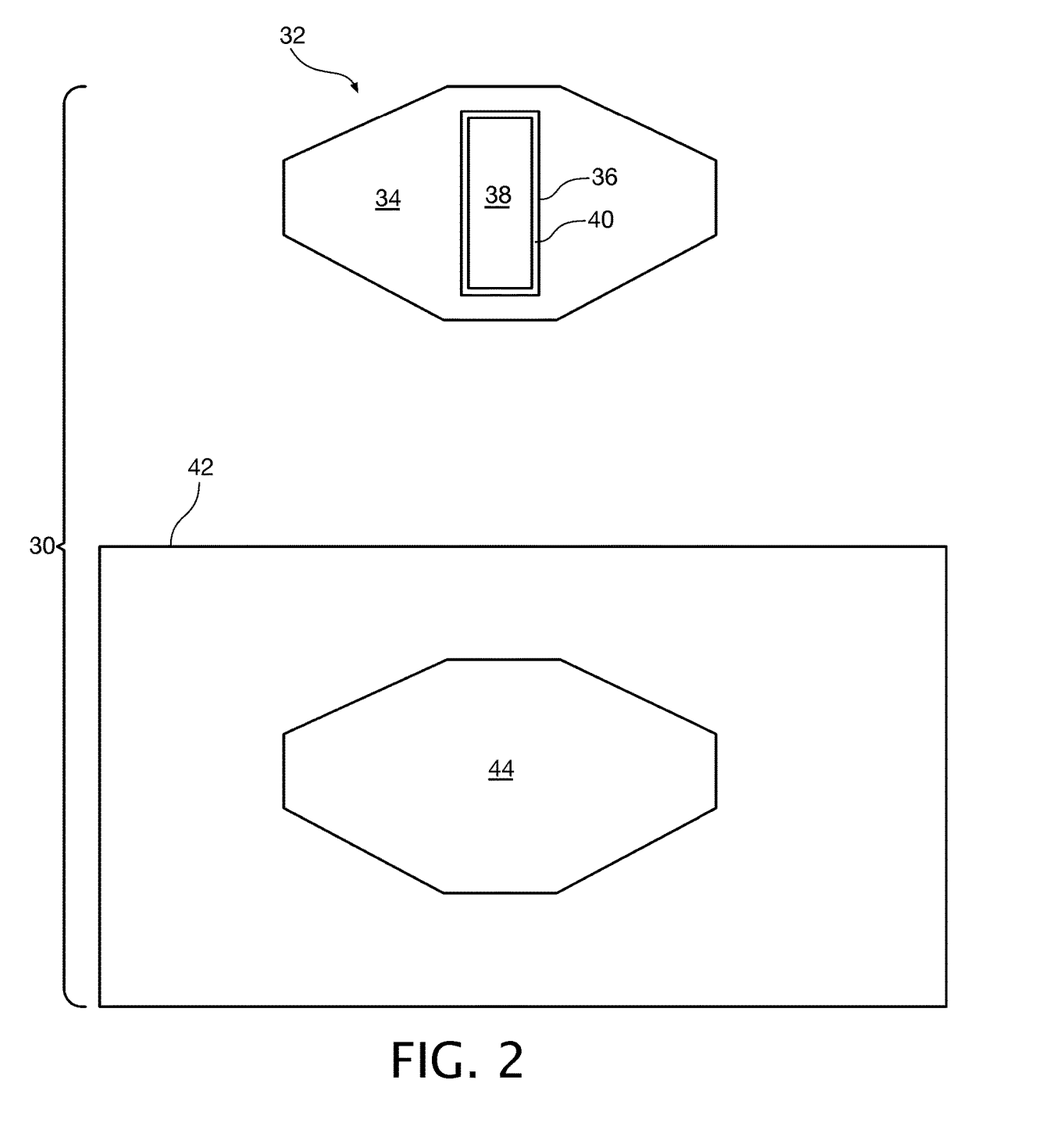
FIG. 2 is a diagram showing a top view of a thermal management package for a power semiconductor in accordance with an aspect of the invention.
Figure 3:
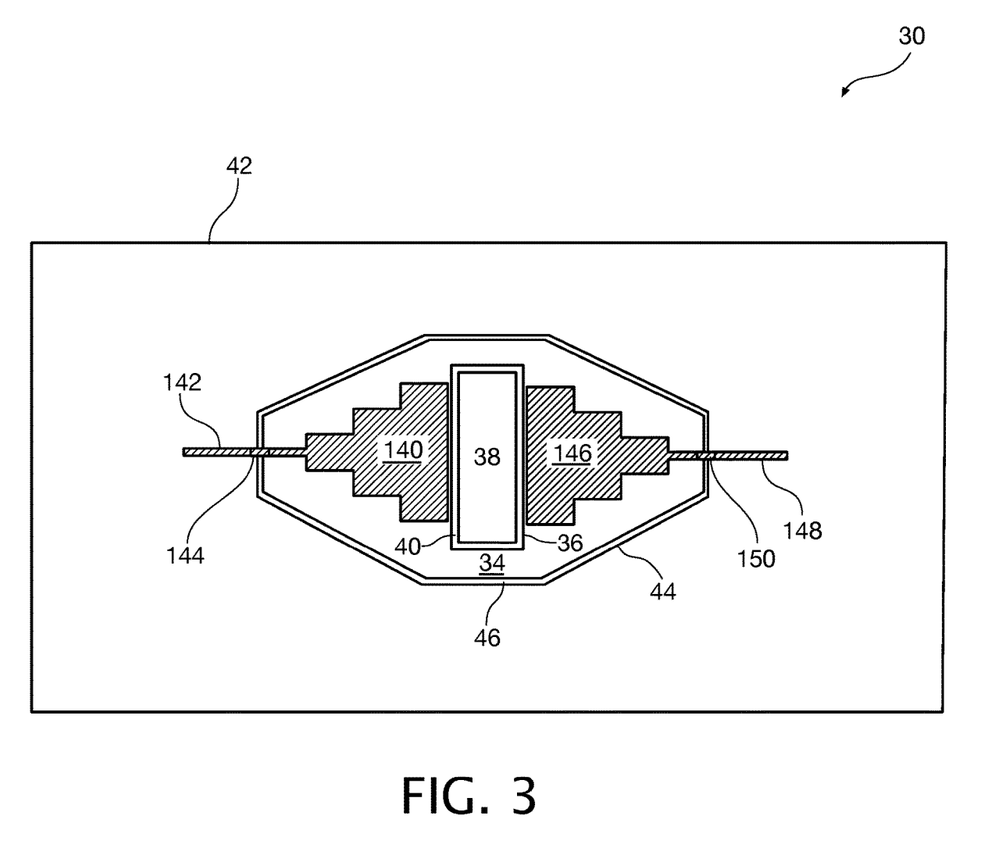
FIG. 3 is a diagram showing a top view of the thermal management package in an assembled state.

Referring first of all to FIG. 2 and FIG. 3, which show top views show a thermal management package 30 in accordance with an aspect of the present invention. The thermal management package 30 has a semiconductor mount sub-assembly 32 formed from a high dielectric constant material substrate 34 including a first window 36 into which a high thermal conductivity slug 38 is bonded using a bonding material shown at reference numeral 40. The dielectric constant is synonymous with relative permittivity, is denoted $\varepsilon_r$, and is a function of frequency. For the purposes of this document, the frequency of interest is the frequency at which the high dielectric constant material substrate 34 exhibits the lowest dielectric constant over the operating frequency of the semiconductor device. For the purposes of this document, a high dielectric constant material from which the high dielectric constant material substrate 34 is formed is defined as a material exhibiting an $\varepsilon_r$ of greater than about 4 at the frequency of interest. For the purposes of this document high thermal conductivity is defined as a thermal conductivity greater than about 250 W/meter-kelvin. In one embodiment of the invention, the high dielectric constant material substrate 34 may be a ceramic-Polytetrafluoroethylene (PTFE) composite material.

The high thermal conductivity slug 38 serves as a heat sink for the thermal management package 30 to extract heat from a semiconductor device thermally coupled to the high thermal conductivity slug 38, which high thermal conductivity slug 38 may be formed from a material such as Cu, AlN, diamond, or other high thermal conductivity material. For the purposes of this document a slug is defined as a circular or polygonally shaped piece of a high thermal conductivity material, having a length and width (or diameter) greater than its thickness. While FIG. 2 shows a rectangularly shaped high thermal conductivity slug 38, persons of ordinary skill in the art will appreciate that the high thermal conductivity slug 38 is not limited to being rectangular in shape and may be shaped to fit the needs of any given design. The bonding material 40 is preferably an adhesive suitable for use in environments characterized by repeated thermal and mechanical cycling.

An outer substrate 42 is formed from a low dielectric constant material and includes a second window 44 into which the semiconductor mount sub-assembly 32 is bonded using a bonding agent shown at reference numeral 46 in FIG. 3. For the purposes of this document a low dielectric constant material is defined as a material exhibiting an $\varepsilon_r$ of lower than about 4 at the frequency of interest. The low dielectric constant material used for outer substrate 42 may be used for mounting components that perform non-sensitive DC or RF functions, and can be formed from a commercial grade laminate such as RO4350 printed circuit board laminate material available from Rogers Corporation of Chandler, Ariz.

Referring now to FIG. 3, a top view shows a representative illustrative embodiment of assembled thermal management package 30. The high thermal conductivity slug 38 is shown in position inserted in the first window 36 of the high dielectric constant material substrate 34 and held in place in the first window 36 by the layer of bonding material 40. The semiconductor mount sub-assembly 32 is shown bonded into the second window 44 in the low dielectric constant material outer substrate 42 using the bonding material shown at reference numeral 46. There is no requirement that bonding material 46 be identical with bonding material 40, and each of bonding material 46 and bonding material 40 are selected in accordance with the properties of the materials to be bonded and the expected thermal and mechanical cycling to be experienced.

Figure 4A:
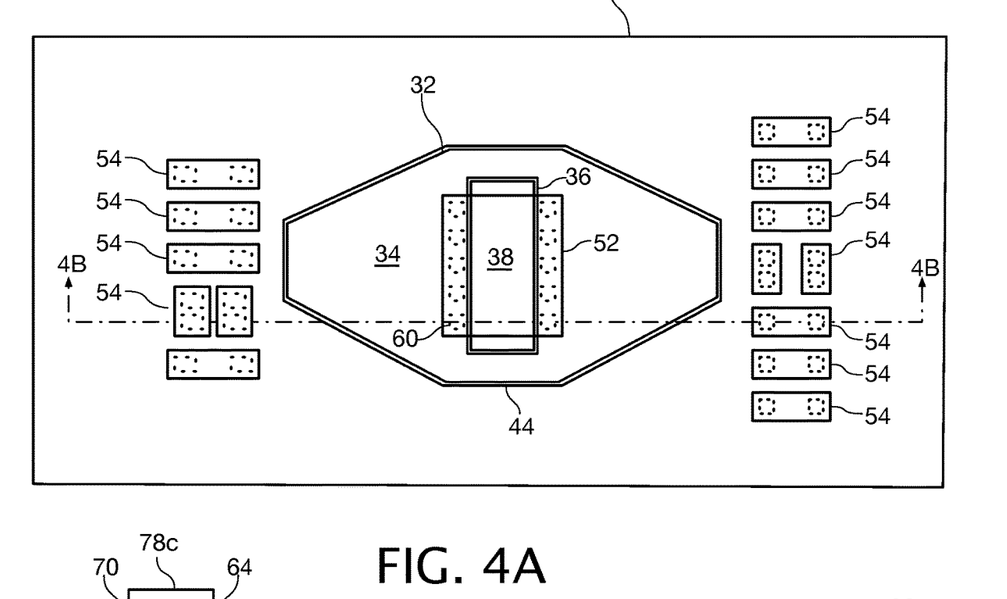
FIG. 4A is a diagram showing a top view of the thermal management package of FIG. 3 showing an integrated circuit and other components mounted on the low dielectric constant material.
Figure 4B:
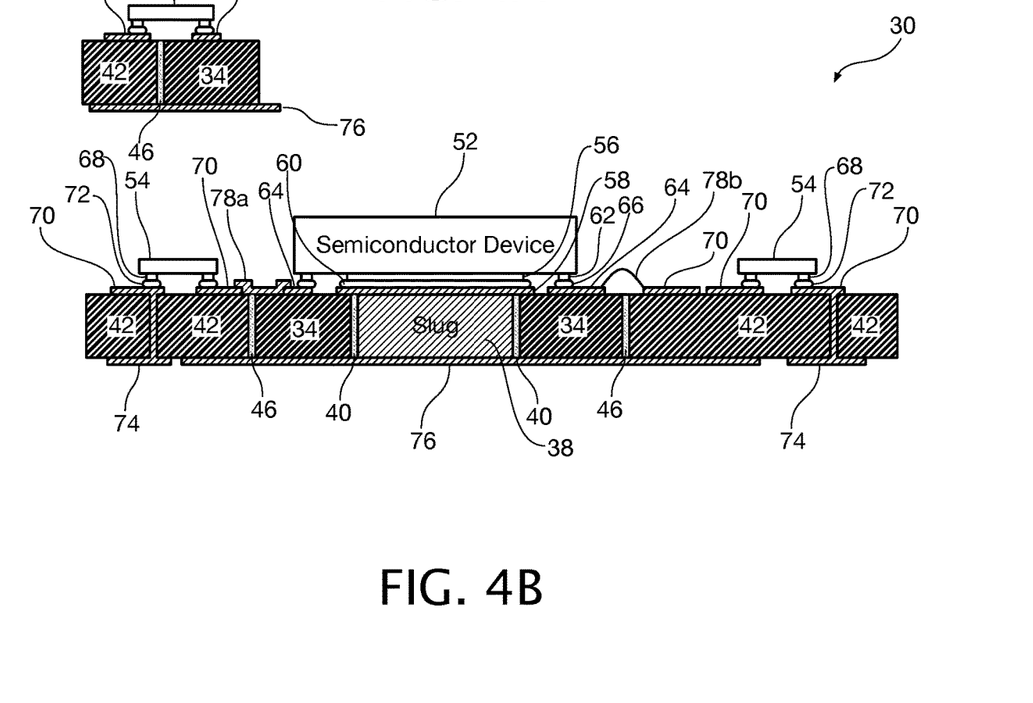
FIG. 4B is a diagram showing a cross-sectional view of the thermal management package shown in FIG. 4A.

Referring now to FIGS. 4A and 4B, top and cross-sectional views, respectively, show the assembled thermal management package 30 of FIG. 2 and FIG. 3 and further show a packaged semiconductor device 52 mounted on a first major surface of the semiconductor mount sub assembly 32 of the assembled thermal management package 30 as well as other components (collectively identified by reference numeral 54) mounted on a first major surface of the low dielectric constant material outer substrate 42. The cross-section of FIG. 4B is taken through dashed lines 4B-4B.

A metal backside surface 56 of the semiconductor device 52, serving as ground, is bonded to, and thermally coupled to, a conductive trace 58 by a layer of solder 60. The conductive trace 58 is thermally coupled to the high thermal conductivity slug 38. A direct thermal path for heat removal from the semiconductor device 52 is thus provided from the metal backside surface 56 of the semiconductor device 52 to the high thermal conductivity slug 38. The semiconductor device 52 can be a power transistor, integrated circuit, monolithic microwave integrated circuit (MMIC) or other semiconductor device. I/O pads of the semiconductor device 52 (the number of which will vary according to the nature of the semiconductor device 52 and one of which is shown at reference numeral 62) are bonded to respective conductive traces (formed from, for example, copper and identified by reference numeral 64) on the first major surface of high dielectric constant material 34 of the assembled thermal management package 30 by, e.g., solder balls one of which is shown at reference numeral 66. The other components 54 are mounted on the first major surface of the low dielectric constant material outer substrate 42 and have I/O pads (ones of which are shown at reference numeral 68) that are bonded to conductive traces (ones of which are shown at reference numeral 70) on the first major face of the low dielectric constant material outer substrate 42 by, e.g., solder balls one of which is shown at reference numeral 72. If needed for signal routing or other purposes such as I/O, conductive traces 74 may be formed on the second major face of the low dielectric constant material outer substrate 42 using plate-through technology as is known in the art.

A ground plane 76 is plated onto the second major surface of the high dielectric constant material substrate 34 and extends over to the second major surface of the low dielectric constant material outer substrate 42. The second major surface of the low dielectric constant material outer substrate 42 is generally coplanar with the second major surface of high dielectric constant material substrate 34 and the ground plane extends across the two surfaces after the plating of ground plane 76 has been performed. The conductive traces 64 and 70 are respectively formed on the high dielectric constant material substrate 34 and the low dielectric constant material outer substrate 42 prior to assembling them into the thermal management package 30.

Connections are made between conductive traces 64 on the major surface of the high dielectric constant material substrate 34 and the conductive traces 70 on the low dielectric constant material outer substrate 42 by using, for example, plated Ni/Au or Ni/Pd/Au traces (one of which is shown at reference numeral 78a) to connect the conductive traces (e.g., 64 and 70 seen to the left side of the semiconductor device 52 in FIG. 4B) that were formed on each of high dielectric constant material substrate 34 and low dielectric constant material outer substrate 42. If desired, solder mask over bare copper (SMOBC) can be employed to prevent completely plating over existing conductive traces. Connections can be also made between conductive traces 64 on the major surface of the high dielectric constant material substrate 34 and the conductive traces 70 on the low dielectric constant material outer substrate 42 by using bonding wires (shown at reference numeral 78b to the right side of the semiconductor device 52 in FIG. 4B and/or by using surface mount components (SMC) such as capacitors, resistors and other SMC circuit elements that serve to make the connections as well as serve as circuit elements (shown at reference numeral 78c in a partial view of FIG. 4B).

Figure 5A:
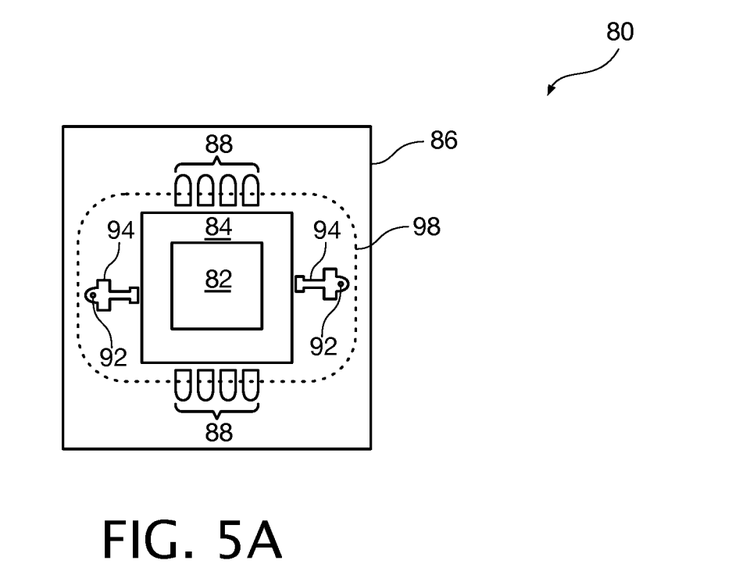
FIG. 5A and FIG. 5B are diagrams showing a top view of another embodiment of a thermal management package in accordance with an aspect of the invention that finds application in, among other applications, 5G/Satellite/mm-wave Power Packaging.
Figure 5B:
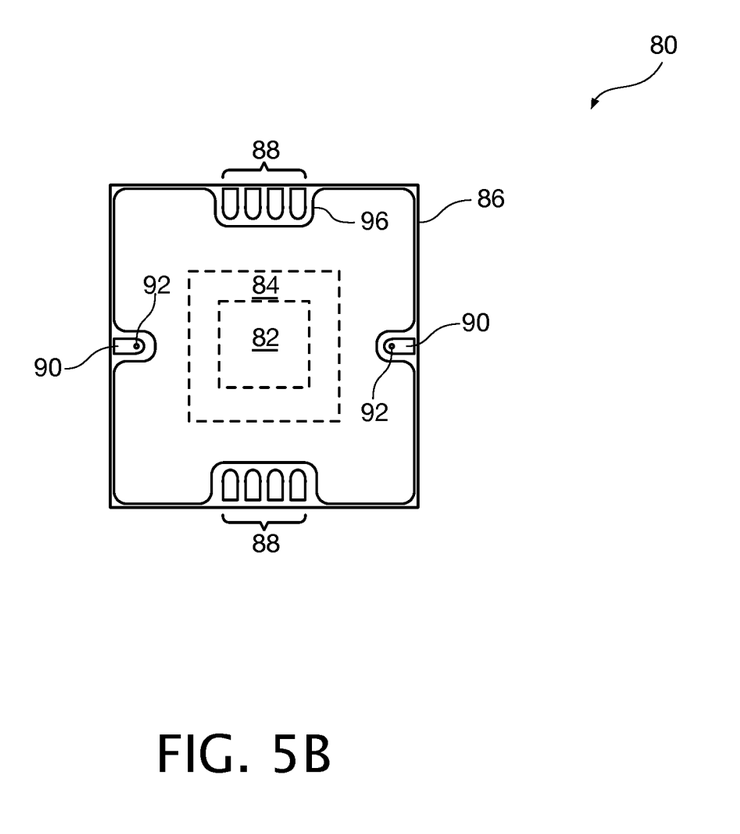

Referring now to FIG. 5A and FIG. 5B, two diagrams show a top and bottom view, respectively, of another embodiment of a thermal management package 80 in accordance with an aspect of the invention including a high thermal conductivity slug 82 disposed in a high dielectric constant material substrate 84 to form a semiconductor mount sub-assembly as has been previously disclosed. The embodiment shown in FIGS. 5A and 5B is usefully employed in, for example, among other applications, 5G/Satellite/mm-wave power packaging.

In FIG. 5A, the top view of the thermal management package 80 is shown including the high thermal conductivity slug 82 embedded in a high dielectric constant material substrate 84 in the form of a ceramic ring. The high dielectric constant material substrate ceramic ring 84 is held within a low dielectric constant material outer substrate 86 such as a laminate material as discussed herein.

I/O pads 88 are shown in this embodiment formed on the top face of the low dielectric constant material outer substrate 86 of the thermal management package 80 and can be connected to one or more devices mounted on the high dielectric constant material substrate 84 in contact with the high thermal copper slug 82 by plating or wire bonding as previously noted.

I/O pads 90 are shown in FIG. 5B on the bottom face of the low dielectric constant material outer substrate 86 connected through plate-through holes 92 in the low dielectric constant material outer substrate 86. Thin-film couplers (e.g., shown as a conductive pattern at reference numerals 94), as well as filters, baluns, and other circuit elements can be printed on the high dielectric constant material substrate 84 to combine multiple power amplifiers, monolithic microwave integrated circuits (MMICs) and other circuits that can be disposed together on the high dielectric constant material substrate 84 in contact with high thermal conductivity slug 82. In an exemplary embodiment with high thermal conductivity slug 82 is formed of copper. This enables wideband MMICs to be narrowband combined off-chip using, e.g., combiners, printed on the high dielectric constant material substrate 84 inside a single package, reducing the chip die area.

The thermal management package 80 allows for embedded metal grounding (as shown at reference numeral 96 in FIG. 5B as continuous metal layer ground plane 96) by forming a continuous metal layer over the bottom faces of the copper slug 82, the high dielectric constant material substrate ceramic ring 84 and the low dielectric constant material outer substrate 86, leaving voids for traces and connections between bottom and top faces of the assembly 80. The continuous metal layer ground plane 96 shown in FIG. 5B is formed over the high thermal conductivity slug 82, the high dielectric constant material substrate ceramic ring 84, and the low dielectric constant material outer substrate 86. A lid, shown in dashed lines 98, can be fitted over the thermal management package 80 as shown once a semiconductor device is bonded to the high thermal conductivity slug 82.

Because the embodiment of the present invention shown in FIGS. 5A and 5B allows for printing of couplers, filters, baluns, without limitation, on the high dielectric constant material substrate to combine multiple Power Amplifiers MMIC's, the present invention is a lower cost solution than the use of couplers in combination with GaN devices. Center frequencies can be varied by using different designs for the printed combiners, baluns, and other components formed on the high dielectric constant material substrate 84, allowing different assemblies to be created on the same footprint. The conductive pattern 94 shown on the low dielectric constant material outer substrate 86 is used as a wideband mm-wave impedance transition, and its geometry can be varied depending on frequency needs as is well known in the art. The conductive pattern 94 is formed on the low dielectric constant material outer substrate 86 because its inductance will be lower than if it was formed on the high dielectric constant material substrate ceramic ring 84, and the wider line width that can be used on the low dielectric constant material outer substrate 86 allows for a larger lower loss plate-through hole to be formed.

Figure 6:
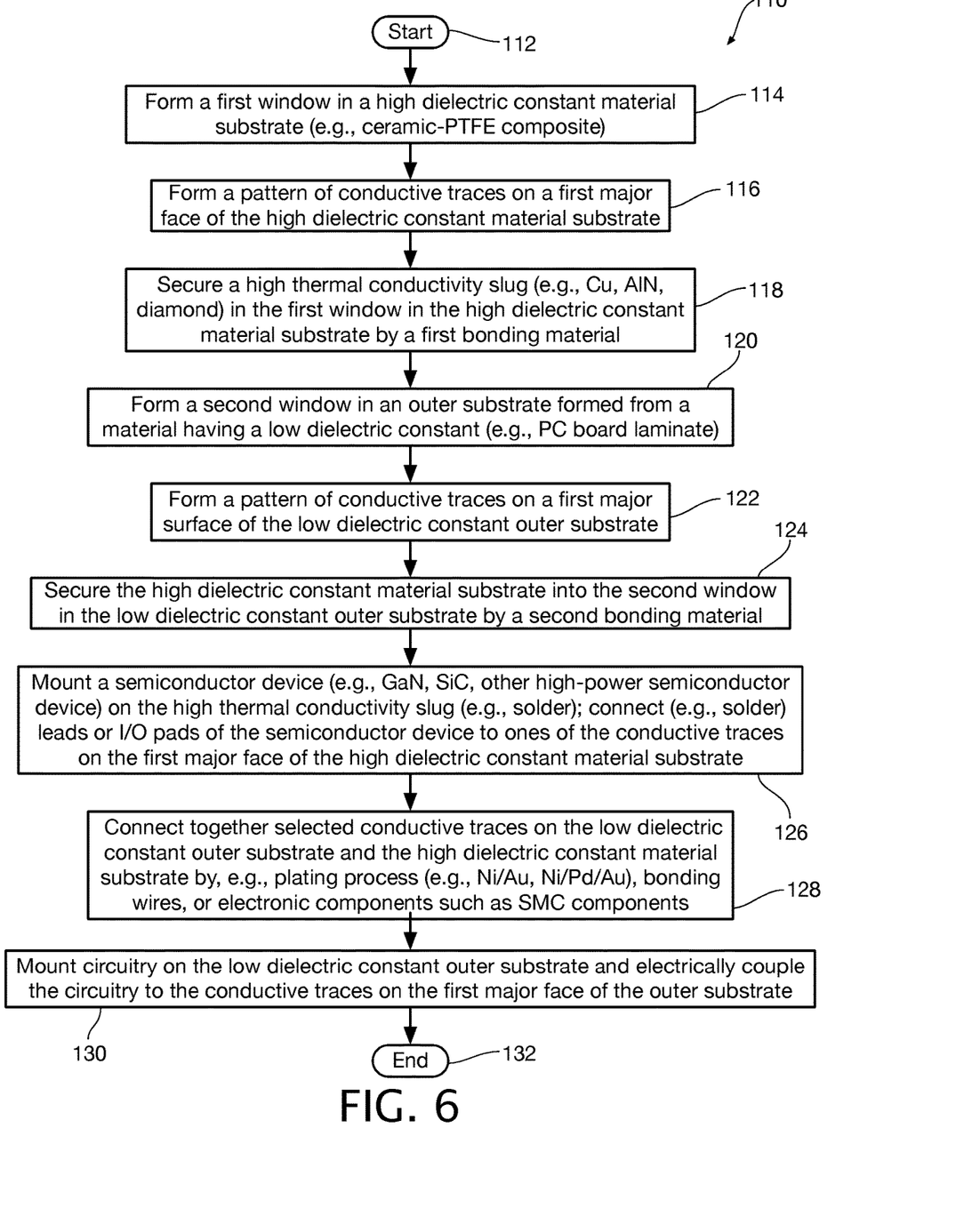
FIG. 6 is a flow diagram illustrating a method for packaging a semiconductor device in accordance with an aspect of the invention.

Referring now to FIG. 6, a flow diagram illustrates a method 110 for packaging a semiconductor device in accordance with an aspect of the invention. The method starts at reference numeral 112. As indicated, some of the steps may be performed in order, or out of sequence, without exceeding the scope of the invention.

At reference numeral 114, a first window is formed in in a high dielectric constant material substrate. In one embodiment, the high dielectric constant material substrate comprises a ceramic-PTFE composite material. At reference numeral 116, a pattern of conductive traces is formed on a first major face of the high dielectric constant material substrate. The order in which the first window is formed at reference numeral 114 and the pattern of conductive traces is formed at reference numeral 116 is not important.

At reference numeral 118, a high thermal conductivity slug is secured in the first window in the high dielectric constant material substrate using a first bonding material, preferably forming a semiconductor mount sub-assembly, such as semiconductor mount sub-assembly 32. In one embodiment, the high thermal conductivity slug is formed from Cu, AlN, or diamond. At reference numeral 120, a second window is formed in an outer substrate formed from a material having a low dielectric constant. In one embodiment of the invention, the low dielectric constant material comprises a printed circuit (PC) board laminate, such as FR-4 glass epoxy. At reference numeral 122, a pattern of conductive traces is formed on a first major face of the low dielectric constant outer substrate. The order in which the second window is formed at reference numeral 120 and the pattern of conductive traces is formed at reference numeral 122 is not important.

At reference numeral 124, the high dielectric constant material substrate is secured into the second window in the low dielectric constant outer substrate by a second bonding material. At reference numeral 126, a semiconductor device is mounted on the high thermal conductivity slug by a process such as soldering. The semiconductor device may be a GaN device, a SiC device, or other high-power semiconductor. Leads or I/O pads of the semiconductor device may be connected to ones of the conductive traces on the major face of the high dielectric constant material substrate at this time. In some embodiments of the invention, the semiconductor device may be secured on the high thermal conductivity slug prior to securing the high dielectric constant material substrate into the first window in the low dielectric constant material outer substrate. There is no requirement that first bonding material be identical with the second bonding material, and each of bonding materials are selected in accordance with the properties of the materials to be bonded and the expected thermal and mechanical cycling to be experienced.

At reference numeral 128, selected conductive traces on the low dielectric constant material outer substrate and the high dielectric constant material substrate are connected together. The connections may be made using a plating process, (e.g., Ni/Au, Ni/Pd/Au), bonding wires, or components such as SMCs. At reference numeral 130, circuitry is mounted on the low dielectric constant material outer substrate, by, for example, soldering, and the disposed circuitry is electrically coupled to ones of conductive traces on the first major face of the low dielectric constant material outer substrate by plating, wire bonds, or bridging SMCs as previously described. Persons skilled in the art will appreciate that mounting the circuitry on the low dielectric constant material outer substrate and the step at reference numeral 126 where the semiconductor device is mounted on the high thermal conductivity slug, and the leads or I/O pads of the semiconductor device are connected to ones of conductive the traces on the first major face of the low dielectric constant material outer substrate may be performed in a single operation such as soldering. The method ends at reference numeral 132.

According to an aspect of the invention, the high dielectric constant material substrate includes at least one conductive trace having a geometry selected to provide an impedance transition between an output of the semiconductor device and the circuitry disposed on the low dielectric constant material outer substrate 42. This aspect of the invention is shown with attention again drawn to FIG. 3. On the left side of the high thermal conductivity slug 38, a conductive trace 140 has a geometry tapering from where the semiconductor device will be mounted on the high thermal conductivity slug 38 towards the left edge of the high dielectric constant material substrate 38. A conductive trace 142 on the low dielectric constant material outer substrate 42 is connected to the end of the conductive trace 140 by, as non-limiting examples, plating a connection 144, using bonding wires, or using a SMC as a bridging element as described herein. On the right side of the high thermal conductivity slug 38 a similar conductive trace 146 has a geometry tapering from where the semiconductor device will be mounted on the high thermal conductivity slug 38 towards the right edge of the high dielectric constant material substrate 34. A conductive trace 148 on the low dielectric constant material outer substrate 42 is connected to the end of the conductive trace 146 by making a connection 150 in one of the several ways described herein. As is well understood by persons of ordinary skill in the art, the tapered geometry of the conductive traces 140 and 146 serve to transition the impedance from a value at the semiconductor device (not shown) to a different value at circuitry (not shown) mounted on the low dielectric constant material outer substrate 42. Use of conductive trace geometry to transition impedances is well known and the particular geometry employed depends on the two values of impedance between which the transition is to be made.

The high thermal conductivity slug of the present invention may be constituted of Cu or AlN, but may also be constituted of chemical vapor deposition (CVD) diamond or similar material. The present invention is not limited to RF power amplifier applications using GaN, and is equally applicable to other power modules, including, without limitation, silicon carbide, and has particular application where high-power devices are being used in applications such as RF/supply switches, limiters, without limitation. The present invention is also not limited to RF frequency applications and offers an essential packaging solution for future millimeter wave 5G and military module applications.

The present invention allows the matching circuitry to be significantly reduced in size. For example, if a high frequency laminate, such as RO4350 material is used for the low dielectric constant material outer substrate 42, the width of a 2-ohm line is 2,500 mils (2.5 inches). If RO6010 material is used for the low dielectric constant material, that same 2-ohm line has a width of 1,400 mils (1.4 inches). If a high dielectric constant ceramic (e.g., Titanate at a dielectric constant of 30) is used for the high dielectric constant material substrate 34 that 2-ohm line has a width of 800 mils (0.8 inches). This is a significant size reduction. By providing a sub-assembly 32 including a high thermal conductivity slug secured in a high dielectric constant material substrate, which is typically a rigid ceramic material, cracking is eliminated, yield is increased, and the cost is reduced compared to having a high dielectric constant material substrate used extensively in the entire pallet. By then inserting this sub assembly into a commercial-grade crossply laminate board, the overall yield is improved compared to thermal management structures using softer and more pliable laminate circuit boards of high dielectric constant with embedded slug for thermal management, and the resultant need for the use of stiffeners or metal backing with such circuit boards is eliminated. It also allows for a platform approach to module design, where a single low dielectric constant material outer substrate board design can support numerous different semiconductors mounted on high dielectric constant material substrates all sharing the same form factor but having different wiring configurations (including features such as impedance transitioning) to support the different semiconductors. Having this ability to provide a single laminated low dielectric constant outer substrate board design to support different semiconductors reduces new design issues and the ability to interchange different high dielectric constant material substrates creates a higher level of uniformity in DC and RF interfaces.

The choice of dielectric materials and semiconductor devices is not limited to those used in the examples presented herein. The shape of the high dielectric constant material substrate is not limited to that shown in the diagrams. The present invention is not limited to the RF power amplifiers but is applicable to any thermal management application for power semiconductors operating in any frequency range.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A thermal management package for a semiconductor device comprising:
   a high dielectric constant material substrate;
   a high thermal conductivity slug disposed in a first window in the high dielectric constant material substrate and held therein by a first bonding material;
   an outer substrate formed from a material having a low dielectric constant and having a second window formed therein;
   the high dielectric constant material substrate disposed in the second window in the low dielectric constant outer substrate and held therein by a second bonding material.

2. The thermal management package of claim 1 wherein the high thermal conductivity slug is formed from one of Cu, AlN, and diamond.

3. The thermal management package of claim 1 wherein the high dielectric constant material substrate is a ceramic-Polytetrafluoroethylene composite material.

4. The thermal management package of claim 1 wherein the low dielectric constant outer substrate is a printed circuit board laminate material.

5. The thermal management package of claim 1 further comprising:
   a semiconductor device mounted on the high thermal conductivity slug;
   circuitry disposed on the high dielectric constant material substrate and electrically coupled to the semiconductor device;
   wherein the high dielectric constant material substrate includes at least one conductive trace having a geometry selected to provide an impedance transition between an output of the semiconductor device and the circuitry disposed on the low dielectric constant outer substrate.

6. The thermal management package of claim 5 wherein the semiconductor device is one of a GaN and a SiC semiconductor device.

7. A method for packaging a semiconductor device comprising:
   forming a first window in a high dielectric constant material substrate;
   forming a pattern of conductive traces on a first major face of the high dielectric constant material substrate;
   securing a high thermal conductivity slug in the first window by a first bonding material;
   forming a second window in an outer substrate formed from a material having a low dielectric constant;
   forming a pattern of conductive traces on a first major face of the low dielectric constant outer substrate; and
   securing the high dielectric constant material substrate into the second window in the low dielectric constant outer substrate by a second bonding material.

8. The method of claim 7 further comprising;
   mounting a semiconductor device on the high thermal conductivity slug and connecting leads or I/O pads of the semiconductor device to ones of conductive traces on the major face of the high dielectric constant material substrate;
   connecting together selected conductive traces on the low dielectric constant outer substrate and the high dielectric constant material substrate; and
   mounting circuitry on the low dielectric constant outer substrate and electrically coupling the circuitry to the conductive traces on the major face of the low dielectric constant outer substrate.

9. The method of claim 7 wherein the high dielectric constant material substrate comprises a ceramic or ceramic-Polytetrafluoroethylene composite material.

10. The method of claim 7 wherein the high thermal conductivity slug comprises one of Cu, AlN, and diamond.

11. The method of claim 7 wherein the low dielectric constant outer substrate comprises printed circuit board laminate material.

12. The method of claim 8 wherein connecting together selected conductive traces on the low dielectric constant outer substrate and the high dielectric constant material substrate comprises connecting together selected conductive traces on the low dielectric constant outer substrate and the high dielectric constant material substrate using a plating process.

13. The method of claim 12 wherein connecting together selected conductive traces on the low dielectric constant outer substrate and the high dielectric constant material substrate using the plating process comprises using one of a Ni/Au and a Ni/Pd/Au plating process.

14. The method of claim 8 wherein connecting together selected conductive traces on the low dielectric constant outer substrate and the high dielectric constant material substrate comprises connecting together selected conductive traces on the low dielectric constant outer substrate and the high dielectric constant material substrate using wire bonding.

15. The method of claim 8 wherein connecting together selected conductive traces on the low dielectric constant outer substrate and the high dielectric constant material substrate comprises connecting together selected conductive traces on the low dielectric constant outer substrate and the high dielectric constant material substrate using an electronic component.

16. The method of claim 7 wherein the high dielectric constant material substrate includes at least one conductive trace that exhibits a geometry selected to provide an impedance transition between an output of the mounted semiconductor device and circuitry disposed on the low dielectric constant outer substrate.

17. The method of claim 7 wherein mounting the semiconductor device comprises mounting one of a GaN and a SiC semiconductor device.

* * * * *